(12) United States Patent
Mayer et al.

(10) Patent No.: US 7,439,761 B2
(45) Date of Patent: Oct. 21, 2008

(54) APPARATUS AND METHOD FOR CONTROLLING A DRIVER STRENGTH

(75) Inventors: Peter Mayer, Neubiberg (DE); Wolfgang Spirkl, Germering (DE); Markus Balb, Munich (DE); Christoph Bilger, Munich (DE); Martin Brox, Munich (DE); Thomas Hein, Munich (DE); Michael Richter, Ottobrunn (DE)

(73) Assignee: Infineon Technologies AG, Munich (DE)

( * ) Notice: Subject to any disclaimer, the term of this patent is extended or adjusted under 35 U.S.C. 154(b) by 135 days.

(21) Appl. No.: 11/457,133

(22) Filed: Jul. 12, 2006

(65) Prior Publication Data

US 2008/0012598 A1    Jan. 17, 2008

(51) Int. Cl.
*H03K 17/16* (2006.01)
*H03K 19/003* (2006.01)

(52) U.S. Cl. ............................. 326/30; 326/82; 327/109

(58) Field of Classification Search .................. 326/17, 326/26, 27, 30, 82, 83; 327/108, 109
See application file for complete search history.

(56) References Cited

U.S. PATENT DOCUMENTS

| 6,222,388 | B1 * | 4/2001 | Bridgewater, Jr. ............ 326/86 |
| 6,639,423 | B2 | 10/2003 | Martin et al. |
| 6,807,650 | B2 | 10/2004 | Lamb et al. |
| 2005/0057281 | A1 | 3/2005 | Yoo |
| 2006/0071689 | A1 | 4/2006 | Poechmueller |

FOREIGN PATENT DOCUMENTS

| DE | 10224977 A1 | 1/2004 |
| DE | 102004047664 A1 | 4/2006 |

* cited by examiner

*Primary Examiner*—Daniel D Chang
(74) *Attorney, Agent, or Firm*—Patterson & Sheridan, L.L.P.

(57) ABSTRACT

Method of controlling a driver strength and a termination impedance of a signal line of an interface, wherein the driver sends an output signal as an alternating voltage with a frequency, wherein the signal line is terminated with a termination impedance, wherein the driver strength is changed depending on a changing of the frequency of the output signal.

19 Claims, 3 Drawing Sheets

US 7,439,761 B2

APPARATUS AND METHOD FOR CONTROLLING A DRIVER STRENGTH

BACKGROUND OF THE INVENTION

1. Field of the Invention

The present invention generally relates to electronic devices. More particularly, the invention relates to interfaces between electronic devices, for example for a memory controller and a memory circuit.

2. Description of the Related Art

Integrated circuits typically have dedicated interface circuits to communicate with other integrated circuits and other systems. These dedicated interface circuits are typically interconnected with conductors that carry signals from one integrated circuit to another. Some signal lines are terminated with a termination impedance that approximates the characteristic impedance of the signal line. These terminations can increase communication reliability by reducing unwanted signal reflections on the signal line. When the characteristic impedance of a signal line is uniform across its length, and the termination impedance matches the characteristic impedance of the signal line, signal reflections may be substantially reduced.

Signals that travel from one integrated circuit to another are becoming faster and faster. As signal speeds increase, the effects of poorly terminated signal lines become more pronounced, and proper terminations become more important.

For high speed interfaces, it is necessary to reload in short times, which means low impedance on the signal line and a high current.

SUMMARY OF THE INVENTION

One embodiment of the invention provides a method for controlling a driver strength and a termination impedance of a signal line of an interface, wherein the driver sends an output signal as an alternating voltage with a frequency, wherein the signal line is terminated with a termination impedance, wherein the driver strength is changed depending on a changing of the frequency of the output signal, and wherein the termination impedance is adjusted depending on the change of the frequency.

A further embodiment of the invention provides a method for controlling a driver strength of an output driver and a termination impedance of a signal line of an interface, wherein the output driver sends an output signal as an alternating voltage with a given frequency, and wherein the driver circuit reduces the driver strength when the frequency of the output signal is reduced.

Another embodiment of the invention provides a signal interface between an output driver and an input circuit that are connected over a signal line, wherein the signal line is terminated by a controllable termination impedance, wherein the output driver sends an output signal with alternating voltage levels with a predetermined frequency with a predetermined driver strength, and wherein the output driver changes the driver strength if the frequency of the output signal is changed.

A further embodiment of the invention provides a signal interface for a memory controller and a memory circuit with an output driver and an input circuit that are connected with a signal line, wherein the output driver comprises a controllable driver strength for changing a driver current, wherein the signal line comprises a controllable termination impedance, and wherein the memory controller changes the driver strength if a frequency of an output signal of the output driver is changed that is sent by the output driver to the input circuit.

An advantage provided by one or more embodiments of the present invention is a reduction of the current of an output driver of an interface. Thus, less energy is necessary for using the interface. A further advantage provided by one or more embodiments of the present invention is a decrease of the temperature of the interface in operation. A further advantage provided by one or more embodiments of the present invention is a fulfillment of a signal line reload time requirement or a bus reload time requirement with a reduced power consumption.

Another advantage provided by one or more embodiments of the present invention is an ability to control the driver strength of the output driver depending on the frequency of the output signal. Thus it may be possible to fulfill a predetermined reload time with a reduced power consumption.

Another advantage provided by one or more embodiments of the present invention is an ability to control a termination impedance depending on a frequency of an output signal. Thus it may be possible to fulfill a predetermined reload time with a reduced power consumption.

BRIEF DESCRIPTION OF THE DRAWINGS

So that the manner in which the above recited features of the present invention can be understood in detail, a more particular description of the invention, briefly summarized above, may be given by reference to embodiments, some of which are illustrated in the appended drawings. It is to be noted however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
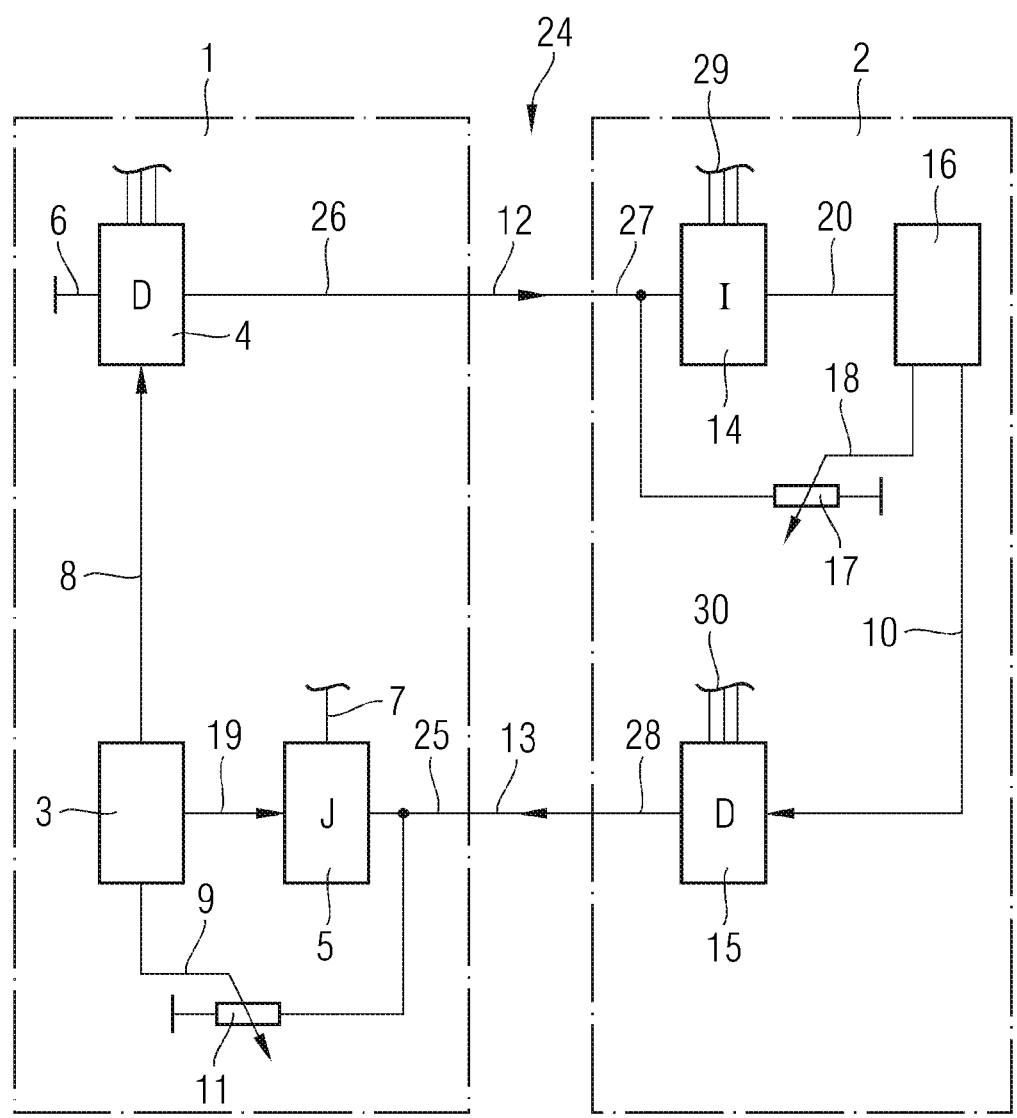
FIG. 1 is a schematic drawing of a first electronic device and a second electronic device connected by an interface according to one embodiment of the invention.

FIG. 1 depicts an embodiment of the present invention with a first electronic device 1 that is connected by a first interface 24 with a second electronic device 2. The first interface 24 may include a first output line 12 and/or a second output line 13 or a bus that connects the first electronic device 1 with the second electronic device 2. The first electronic device 1 comprises a first control circuit 3, a first output driver 4 and a first input circuit 5. The first control circuit 3 is connected by a first control line 8 with the first output driver 4. Additionally, the first control circuit 3 is connected by a first connecting line 19 with the first input circuit 5. The first input circuit 5 comprises a terminal 25 that it is connected with a second output line 13. The terminal 25 is connected with a first termination impedance 11 that is controllable by the first control circuit 3 over a second control line 9. The first input circuit 5 comprises a first output 7 that may be connected with electrical circuits of the first electronic device 1 that are not depicted in detail. The first output driver 4 comprises a first input line 6 that may be connected with other parts of the first electronic device that are not depicted in detail. The first output driver 4 comprises a second terminal 26 that is connected with the first output line 12. The first output line 12 is connected with a third terminal 27 of the second electronic device 2. The third terminal 27 is connected with a second input circuit 14. The second input circuit 14 is connected by a second connecting line 20 with a second control circuit 16. The third terminal 27 is connected with a second termination impedance 17. The second termination impedance 17 may be controllable over a fourth control line 18 by the second control circuit 16 that is part of the second electronic device 2. Furthermore, the second electronic device 2 comprises a second output driver 15 with a fourth terminal 28. The fourth terminal 28 is connected with the second output line 13. The second output driver 15 is connected by a third control line 10 with the second control circuit 16.

The second input circuit 14 may comprise further input/output terminals 29 that are connected with further parts of the second electronic device 2 that are not depicted in the Figure. The second output driver 15 may comprise second in/output terminals 30 that are connected with further parts of the second electronic device 2.

Each of the first output driver 4 and the second output driver 15 may be constructed for outputting an output signal with alternating voltage levels with a given frequency. Depending on the kind of data or the kind of information that may be outputted by the first or second output drivers 4, 15, the frequency of the alternating signal may change. Furthermore, the frequency of the alternating output signal may be changed depending on an operation mode of the first electronic device 1 and/or an operation mode of the second electronic device 2. For transmitting data with high speed, the frequency of the alternating output signal may be higher in a first operation mode. In a second operation mode, in which a low speed for transmitting data is sufficient, the frequency of the output signal may be reduced to a lower frequency.

In one embodiment, the first control circuit 3 controls the operation mode of the first output driver 4 by the first control line 8. The first control circuit 3 may switch the first output driver 4 in a first operation mode during which the first output driver 4 sends an output signal with a first frequency with alternating voltage levels to the first output line 12. For attaining the high frequency and for attaining a short reload time of the first output line 12, the first output driver 4 uses a first driver strength for outputting the output signal with high current. The high driver strength has the advantage that the reload time between a low voltage level and a high voltage level of the output signal on the first output line 12 is reduced. Therefore, data and/or control commands may be transmitted with a higher alternating frequency and with higher speed. However, the power consumption of the first output driver 4 may be correspondingly increased. The high power consumption heats the first electronic device 1 up to an increased temperature that may result in adverse functioning of the first electronic device 1.

In a second operation mode, the first control circuit 3 sets the first output driver 4 to the second operation mode, in which the frequency of the output signal is reduced. The first control circuit 3 controls the driver strength of the first output driver 4 and reduces the driver strength. In the second operation mode, a lower speed for transmitting data or control commands from the first electronic device 1 to the second electronic device 2 is sufficient, and thus, the alternating frequency of the output signal may be reduced. The output signal refers to an alternating voltage signal with high voltage and low voltage levels. Furthermore, the uprising or the falling part of the output signal may be used from the second electronic device for determining a time point.

Because of the lower speed for transmitting data or control commands, a lower frequency of the output signal is used. Additionally, the driver strength of the first output driver 4 is reduced in the second operation mode. Additionally, the second termination impedance 17 that is connected with the first output line 12 may be controlled depending on the frequency of the output signal. In the depicted embodiment of FIG. 1, the second termination impedance 17 is part of the second electronic device 2, and a command signal is sent by the first output driver 4 to the second input circuit 14 of the second electronic device 2 to adapt the second termination impedance 17 according to the used frequency of the output signal. This control command is received by the second input circuit 14 and passed by the second connecting line 20 to the second control circuit 16. The second control circuit 16 checks the control command and controls accordingly the value of the second termination impedance 17. If the driver strength of the first output 4 is reduced, then the value of the second termination impedance 17 is also reduced to adapt the impedance of the first output line 12 to the reduced driver strength and the reduced frequency of the output signal.

This embodiment provides that the termination impedance of the first output line 12 is adapted to the driver strength of the first output driver 4 and to the frequency of the output signal.

In a further embodiment of the present invention, the driver strength of the first output driver 4 and the value of the second termination impedance 17 may be controlled to attain basically an unchanged swing between a low voltage level and a high voltage level of the output signal for different frequencies. Swing means the voltage difference between a high voltage level and a low voltage level.

The second output driver 15 may be controlled in the same manner by the second control circuit 16 and the driver strength of the second output driver 15 may be changed for different operation modes. For a first operation mode with a high frequency of the alternating output signal, the driver strength of the second output driver 15 may be controlled and adjusted to a high driver strength resulting in a higher driver current. In a second operation mode, the driver strength of the second output driver 15 may be controlled by the second control circuit 16 and adjusted to a lower driver strength, resulting in a lower driver current. In a further embodiment, the second output driver 15 may be controlled additionally by the second control circuit 16 to transmit a control command to the first input circuit 5 of the first electronic device 1 to adapt the first termination impedance 11. The control command is received by the first input circuit 5 and passed to the first control circuit 3. The first control circuit 3 checks the control command and controls the value of the first termination impedance 11 accordingly to the control command. This means that in the first operation mode, the value of the first termination impedance 11 is higher than in the second operation mode. The first termination impedance 11 is adapted to fulfill the necessary reload time for the alternating output signal on the second output line 13.

In a further embodiment, the driver strength of the second output driver 15 and the value of the first termination impedance 11 are controlled to attain a basically similar swing between a high voltage level and a low voltage level of the alternating output signal.

The first and the second electronic devices 1, 2 may be any kind of electronic device that uses an interface for exchanging signals with an alternating voltage level and a changing frequency depending on different operation modes. In a further embodiment, the first electronic device 1 may be a controller circuit, for example, a memory controller circuit. The second electronic device 2 may be a memory circuit, for example, a dynamic random access memory. In one embodiment, the controller circuit reduces the driver strength of the first output driver 4 for a lower frequency of the output signal. Additionally, the memory circuit may adjust accordingly the second termination impedance 17 to a lower value. In a further embodiment, the memory circuit calibrates the second termination impedance 17 to a lower value to keep a swing of a high voltage level and a low voltage level of the output signal basically constant even though the frequency of the output signal and the driver strength of the first output driver 4 has been changed.

In a further embodiment, the second electronic device 2 does not receive a control command by the first electronic device 1 for indicating a changing of the frequency of the output signal. In this embodiment, the second electronic device 2 checks, by the second control circuit 16, the frequency of the output signal received by the second input circuit 14. If a change in the frequency of the output signal is detected, then the second control circuit 16 changes accordingly the value of the second termination impedance 17. Basically, the value of the second termination impedance 17 is reduced when the frequency of the received output signal is decreased. In a further embodiment, the second control circuit 16 may try to achieve a constant swing of a high voltage level and a low voltage level of the alternating output signal that is received by the second input circuit 14 by adjusting the value of the second termination impedance 17 accordingly even though the driver strength of the first output driver and/or the frequency of the output signal are changed.

In a further embodiment, the first electronic device 1 is embodied as a memory controller and the second electronic device 2 is embodied as a memory circuit. The memory controller may switch the frequency of the output signal by controlling the first output driver 4 to a different frequency. Additionally, the memory controller may change the driver strength of the first output driver 4. Furthermore, the memory controller may send a mode register command to the memory circuit to adapt the second termination impedance 17. In a further embodiment, the memory controller may send a mode register command to the memory circuit to adapt the second termination impedance 17 and to adapt the driver strength of the second output driver 15 accordingly. The driver strength of the first output driver 4 and the value of the second termination impedance 17 may match in such way to allow a predetermined reload time of the first output line 12 with a reduced interface current. Thus, the power consumption may be reduced.

Depending on the embodiment, a bidirectional interface 24 may be used for exchanging data and signals between the first and the second electronic devices 1, 2. In a further embodiment, the interface may be realized as a signal bus between the first and the second electronic devices 1, 2. In a further embodiment, a one-directional interface may be disposed for sending data only from the first electronic device 1 to the second electronic device 2.

Figure 2:
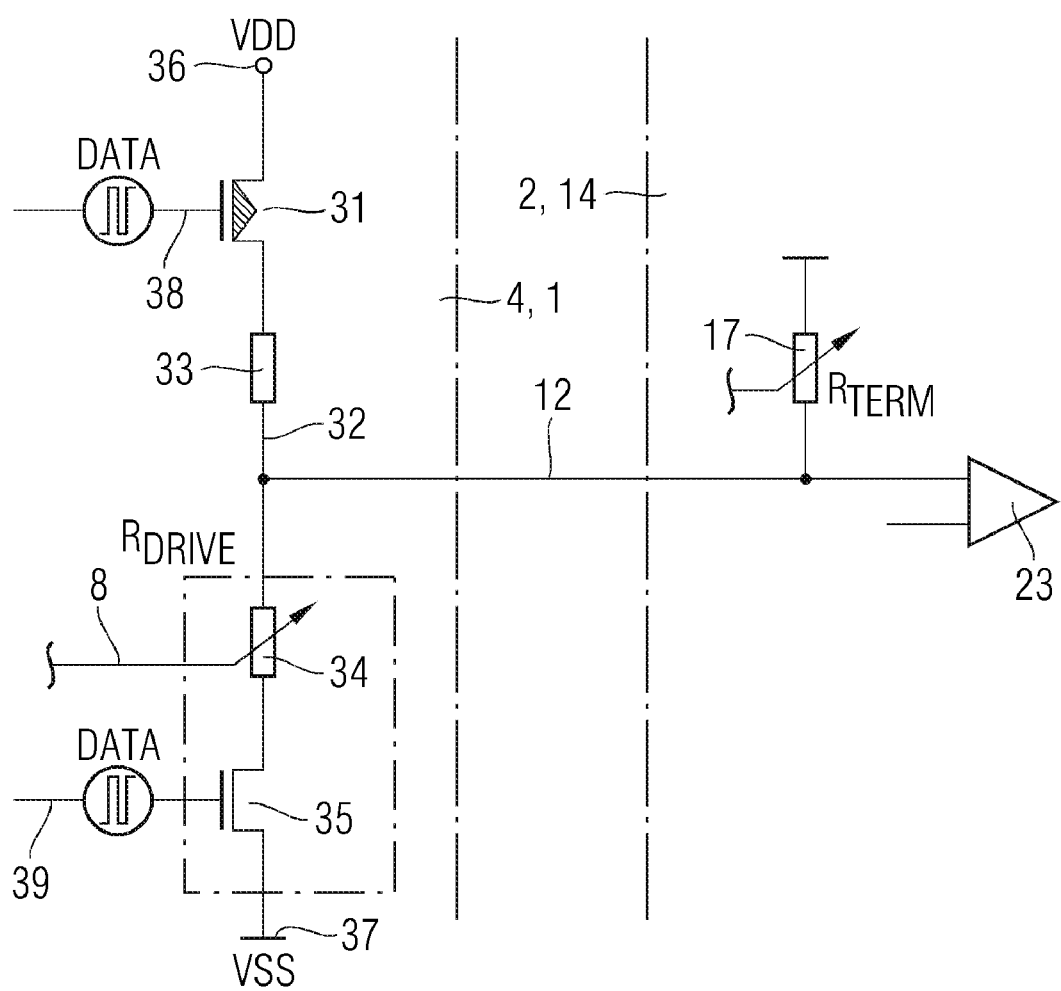
FIG. 2 is a schematic drawing of a part of an output driver according to one embodiment of the invention.

FIG. 2 depicts a partial view in greater detail of the first output driver 4 and the second input circuit 14. The first output driver 4 may be realized with a first transistor 31 that is connected in series with a first resistor 33, a third connecting line 32, a controllable third impedance 34 with a second transistor 35. The series connection of the first and the second transistor 31, 35 is disposed between a high voltage source 36 and a low voltage source 37. A gate electrode of the first transistor 31 is connected with a first data line 38. A gate electrode of the second transistor 35 is connected with a second data line 39. The first data line 38 and the second data line 39 may be controlled by the first output driver 4 to generate an alternating output signal. The third impedance 34 is connected with the first control line 8. The first and the second transistors 31, 35 may be realized as one npn-transistor and one pnp-transistor.

Depending on the voltage levels of the first data line 38 and the second data line 39, a high or a low voltage level is put on the first output line 12 that is connected with the third connecting line 32. Furthermore, depending on the value of the third impedance 34, the current is adjusted (i.e., more or less current is used accordingly) for driving the output signal on the first output line 12 by the first output driver 4.

The first output line 12 is connected with an amplifier circuit 23 that is part of the second input circuit 14, and the first output line 12 is connected with the second termination impedance 17. The second termination impedance 17 is connected with the fourth control line 18 (shown in FIG. 1). The value of the second termination impedance 17 may be controlled by the second control circuit 16 (shown in FIG. 1) as discussed above.

The driver strength of the second output driver 15 may also be controlled by a controllable fourth impedance, similarly to that depicted and described for the first output driver 4 in FIG. 2. Therefore, the second output driver 15 may comprise a fourth impedance that may be controlled by the second control circuit 16 for adjusting the driver strength of the second output driver 15.

In a further embodiment, the value of the third impedance 34 and the value of the second termination impedance 17 may be controlled for different frequencies of the output signal to fulfill the following rule: RD/(RT+RD) is constant, whereby RD designates the value of the third impedance 34 and RT designates the value of the second termination impedance 17.

Depending on the embodiment, the first resistor 33 may also be realized as a controllable resistor, whereby the value of controllable resistor may also be controlled by the first control circuit 3. Therefore, it might be possible to influence the current from the low voltage source 37 and/or the current from the high voltage source 36.

In the embodiment depicted in FIG. 2, the second termination impedance 17 may be realized as an adjustable resistor. Instead of the adjustable resistor, the impedance of the first output line 12 may also be adjusted by an adjustable capacitor or any other suitable impedance means.

In the embodiment of the second electronic device 2 as a memory circuit, the memory circuit may comprise a command register that is programmed by the second control circuit 16 when a mode register command is received from the memory control circuit 1. In response to receiving a mode register command, the memory circuit may adapt the driver strength, for example, by adjusting the value of the impedance 34 and the value of the termination impedance of the first output line 12.

Figure 3:
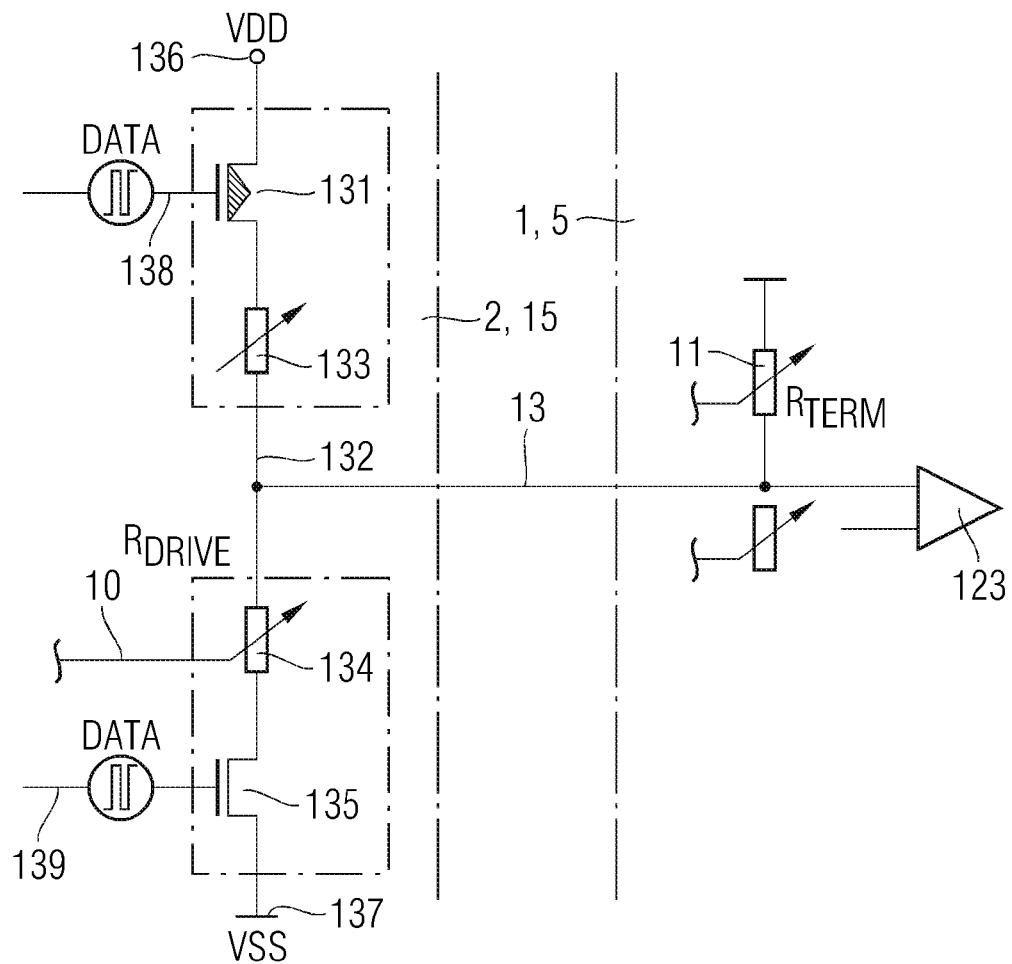
FIG. 3 is a schematic drawing of a memory circuit according to one embodiment of the invention.

FIG. 3 depicts in greater detail a part of the second output driver 15 with a structure which is similar to the first output driver 4 as depicted in FIG. 2.

The second output driver 15 may be realized with a first transistor 31 that is connected in series with a further first resistor 133, a further third connecting line 132, a controllable further third impedance 134 with a further second transistor 135. The series connection of the first and the second transistors 131, 135 is disposed between a further high voltage source 136 and a further low voltage source 137. A gate electrode of the further first transistor 131 is connected with a further first data line 138. A gate electrode of the further second transistor 135 is connected with a further second data line 139. The further first data line 138 and the further second data line 139 may be controlled by the second output driver 15 to generate an alternating output signal. The further third impedance 134 is connected with the third control line 10. The value of the further third impedance 134 may be controlled by the second control circuit 16 (shown in FIG. 1). The further first and second transistors 131, 135 may be realized as respective npn and pnp-transistors.

Depending on the voltage levels of the further first data line 138 and the further second data line 139, a high or a low voltage level is put on the second output line 13 that is connected with the further third connecting line 132. Furthermore, depending on the value of the further third impedance 134, more or less current is used for driving the output signal on the second output line 13 by the second output driver 15.

The second output line 13 is connected with a further amplifier circuit 123 that is part of the first input circuit 5, and the second output line 13 is connected with the first termination impedance 11. The first termination impedance 11 is connected with the second control line 9. The value of the first termination impedance 11 may be controlled by the first control circuit 3 as discussed above.

In a further embodiment, the value of the further third impedance 134 and the value of the first termination impedance 11 may be controlled for different frequencies of the output signal to fulfill the following rule: RD/(RT+RD) is constant, whereby RD designates the value of the further third impedance 134 and RT designates the value of the first termination impedance 11.

Depending on the embodiment, the further first resistor 133 may also be realized as a controllable resistor, wherein the value of the further first resistor 133 may also be controlled by the first control circuit 3. Therefore, it might be possible to influence the current from the low voltage level 137 and/or the current from the high voltage level 136.

In the embodiment depicted in FIG. 3, the first termination impedance 11 may be realized as an adjustable resistor. Instead of the adjustable resistor, the impedance of the first output line 12 may also be adjusted by an adjustable capacitor or any other suitable impedance means.

In one embodiment, the second electronic device 2 is a memory circuit, and the memory circuit may comprise a command register that is programmed by the second control circuit 16 when a mode register command is received from the memory control circuit 1. In response to receiving a mode register command, the memory circuit may adapt the driver strength, for example, the value of the third impedance 134 and the value of the termination impedance of the second output line 13.

Figure 4:
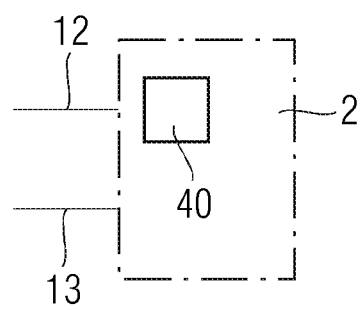
FIG. 4 is a schematic drawing of a part of a second embodiment of an interface.

FIG. 4 depicts a schematic drawing of a second electronic device embodied as a memory circuit with a command register 40 that is used for storing a control command that is received by the first signal line 12.

While the foregoing is directed to embodiments of the present invention, other and further embodiments of the invention may be devised without departing from the basic scope thereof, and the scope thereof is determined by the claims that follow.

What is claimed is:

1. A method of operating an integrated circuit having an output driver connected to a signal line having a termination impedance, comprising:
    sending an output signal by the output driver as an alternating voltage with a frequency based on at least one of:
       (i) information outputted by the output driver and (ii) an operating mode of the integrated circuit;
    changing a driver strength of the output driver depending on a changing of the frequency of the output signal; and
    adjusting the termination impedance depending on the change of the frequency, wherein the signal line is terminated with the termination impedance.

2. The method of claim 1, wherein the driver strength and the termination impedance are controlled to achieve a substantially constant swing of high and low voltage levels of the output signal at different frequencies of the output signal.

3. The method of claim 1, wherein the driver strength and the termination impedance are controlled to keep a swing of the voltage levels substantially constant with a reduced current of the output driver at lower frequencies of the output signal.

4. The method of claim 1, wherein the output driver comprises a controllable impedance and wherein the driver strength is controlled by an impedance value of the controllable impedance.

5. The method of claim 1, wherein the output driver is part of a controller circuit and the signal line is connected with an input circuit of a memory circuit, wherein the input circuit comprises a controllable impedance that is connected with the signal line, wherein the controller circuit changes the driver strength with a change of the frequency of the output signal, and wherein the memory circuit is connected with a second control circuit that controls the controllable impedance with the change of the frequency of the output signal.

6. The method of claim 1, wherein the output driver is part of a controller circuit and the signal line is connected with an input circuit of a memory circuit, wherein the input circuit comprises a controllable impedance that is connected with the signal line, wherein the memory circuit comprises a second driver circuit that is connected with a second signal line with the controller circuit, wherein the controller circuit comprises a second controllable impedance that is connected with the second signal line, wherein the driver strength of the driver circuit and the second impedance are changed with the change of the frequency of the output signal, and wherein a driver strength of the second driver circuit and an impedance of the input circuit are changed with the change of the frequency of the output signal.

7. A method of operating an integrated circuit having an output driver connected to a signal line having a termination impedance, comprising:
    sending an output signal by the output driver as an alternating voltage with a frequency based on at least one of:
       (i) information outputted by the output driver and (ii) an operating mode of the integrated circuit; and
    changing a driver strength of the output driver depending on a changing of the frequency of the output signal, wherein the output driver comprises a controllable impedance and wherein the driver strength is controlled by an impedance value of the controllable impedance, and wherein the controllable impedance is increased for a reduced frequency of the output signal and wherein the controllable impedance is decreased for an increased frequency of the output signal.

8. A method of operating an integrated circuit having an output driver connected to a signal line having a termination impedance, comprising:
    sending an output signal of the output driver as an alternating voltage with a given frequency based on at least one of: (i) information outputted by the output driver and (ii) an operating mode of the integrated circuit;
    reducing a driver strength of the output driver when a frequency of the output signal is reduced; and
    reducing the termination impedance when the frequency of the output signal is reduced.

9. The method of claim 8, wherein an interface comprises the signal line, and wherein the interface is an interface between a memory controller circuit and a memory circuit.

10. An integrated circuit having a signal interface, comprising:
an output driver connected with a signal line, wherein the signal line is terminated by a controllable termination impedance, wherein the output driver sends an output signal with alternating voltage levels with a predetermined frequency with a predetermined driver strength, and wherein the output driver changes the driver strength when a frequency of the output signal is changed.

11. The signal interface of claim 10, wherein the output driver reduces the driver strength when the frequency of the output signal is reduced.

12. The signal interface of claim 11, wherein the output driver reduces the driver strength and sends a command to the input circuit to reduce the termination impedance when the frequency of the output signal is reduced.

13. The signal interface of claim 11, wherein the output driver controls the driver strength and wherein the input circuit controls the termination impedance to provide a substantially constant swing of voltage levels of the output signal at different frequencies.

14. The signal interface of claim 10, further comprising:
an input circuit that is connected with the signal line, wherein the input circuit reduces the termination impedance when the frequency of the output signal is reduced.

15. A system, comprising:
a memory controller; and
a memory circuit having an output driver and an input circuit that are connected with a signal line, wherein the output driver is configured to provide a controllable driver strength for changing a driver current, wherein the signal line comprises a controllable termination impedance, and wherein the memory controller is configured to change the driver strength when a frequency of an output signal sent by the output driver to the input circuit is changed.

16. The system of claim 15, wherein the memory controller controls the driver strength and wherein the memory circuit controls the termination impedance to provide a substantially constant swing between a high voltage level and a low voltage level of the output signal at different frequencies of the output signal.

17. The system of claim 16, wherein the output driver is part of the memory controller, wherein the input circuit comprises a controllable impedance that is connected with the signal line, wherein the memory circuit comprises a second output driver, wherein the second output driver comprises a second controllable impedance, wherein the memory controller changes the driver strength of the output driver and the second controllable impedance when the frequency of the output signal changes and wherein the memory circuit changes a driver strength of the second output driver and the impedance of the input circuit when the frequency of the output signal from the second output driver changes.

18. The system of claim 15, wherein the output driver is part of the memory controller, wherein the input circuit comprises a controllable impedance that is connected with the signal line, wherein the memory circuit comprises a second output driver, wherein the second output driver comprises a second controllable impedance, wherein the memory controller changes the driver strength of the output driver and the second controllable impedance when the frequency of the output signal changes and wherein the memory circuit changes a driver strength of the second output driver and the impedance of the input circuit when the frequency of the output signal from the second output driver changes.

19. The system of claim 15, wherein the memory circuit further comprises a command register for storing a control command received from the memory controller, wherein in response to receiving the control command, the memory circuit adjusts the driver strength and the controllable termination impedance.

* * * * *